United States Patent
Tanada

(10) Patent No.: US 8,324,077 B2
(45) Date of Patent: Dec. 4, 2012

(54) SEMICONDUCTOR DEVICE AND MANUFACTURING METHOD THEREOF

(75) Inventor: Yoshifumi Tanada, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/024,808

(22) Filed: Feb. 10, 2011

(65) Prior Publication Data

US 2011/0129987 A1 Jun. 2, 2011

Related U.S. Application Data

(62) Division of application No. 12/136,875, filed on Jun. 11, 2008, now Pat. No. 7,915,684.

(30) Foreign Application Priority Data

Jun. 29, 2007 (JP) ................................. 2007-173452

(51) Int. Cl.
*H01L 21/30* (2006.01)

(52) U.S. Cl. ........ 438/455; 438/409; 438/458; 438/460; 438/479; 257/72; 257/79; 257/E21.568

(58) Field of Classification Search ........................ None
See application file for complete search history.

(56) References Cited

U.S. PATENT DOCUMENTS

| | | | |
|---|---|---|---|
| 5,837,614 A * | 11/1998 | Yamazaki et al. | ............ 438/789 |
| 6,271,101 B1 | 8/2001 | Fukunaga | |
| 6,335,231 B1 * | 1/2002 | Yamazaki et al. | ............ 438/151 |
| 6,372,609 B1 | 4/2002 | Aga et al. | |
| 6,380,046 B1 | 4/2002 | Yamazaki | |
| 6,818,531 B1 * | 11/2004 | Yoo et al. | ...................... 438/458 |
| 7,132,317 B2 | 11/2006 | Arao | |
| 7,160,784 B2 | 1/2007 | Yamazaki et al. | |

(Continued)

FOREIGN PATENT DOCUMENTS

EP 1 045 448 A1 10/2000

(Continued)

OTHER PUBLICATIONS

Welser et al., "Strain Dependence of the Performance Enhancement in Strained-Si n-MOSFETs", IEDM 94: Technical Digest of International Electron Devices Meeting, 1994, pp. 373-376.

Li et al., "SiGe pMOSFET's with Gate Oxide Fabricated by Microwave Electron Cyclotron Resonance Plasma Processing", IEEE Electron Device Letters, vol. 15, No. 10, Oct. 1994, pp. 402-405.

*Primary Examiner* — N. Drew Richards
*Assistant Examiner* — Kyoung Lee
(74) *Attorney, Agent, or Firm* — Nixon Peabody LLP; Jeffrey L. Costellia

(57) ABSTRACT

To provide a structure and a manufacturing method for efficiently forming a transistor to which tensile strain is preferably applied and a transistor to which compressive strain is preferably applied over the same substrate when stress is applied to a semiconductor layer in order to improve mobility of the transistors in a semiconductor device. Plural kinds of transistors which are separated from a single-crystal semiconductor substrate and include single-crystal semiconductor layers bonded to a substrate having an insulating surface with a bonding layer interposed therebetween are provided over the same substrate. One of the transistors uses a single-crystal semiconductor layer as an active layer, to which tensile strain is applied. The other transistors use single-crystal semiconductor layers as active layers, to which compressive strain using part of heat shrink generated by heat treatment of the base substrate after bonding is applied.

10 Claims, 10 Drawing Sheets

U.S. PATENT DOCUMENTS

| | | |
|---|---|---|
| 7,618,904 B2 | 11/2009 | Yamazaki et al. |
| 2001/0004190 A1 | 6/2001 | Nishi et al. |
| 2002/0179908 A1 | 12/2002 | Arao |
| 2003/0103025 A1 | 6/2003 | Kurokawa et al. |
| 2006/0276012 A1 | 12/2006 | Yamazaki et al. |
| 2007/0065995 A1 | 3/2007 | Arao |

FOREIGN PATENT DOCUMENTS

| | | |
|---|---|---|
| JP | 09-219524 | 8/1997 |
| JP | 11-163363 | 6/1999 |
| JP | 2000-124092 | 4/2000 |

\* cited by examiner

SEMICONDUCTOR DEVICE AND MANUFACTURING METHOD THEREOF

BACKGROUND OF THE INVENTION

1. Field of the Invention

The present invention relates to a semiconductor device including a thin film transistor over an insulating surface and a manufacturing method thereof.

2. Description of the Related Art

An integrated circuit has been developed, which uses a semiconductor substrate called a silicon-on-insulator (hereinafter also referred to as SOI) which has a thin single-crystal semiconductor layer over an insulating surface, instead of a silicon wafer which is manufactured by thinly slicing an ingot of a single-crystal semiconductor. An integrated circuit using an SOI substrate has attracted attention as a circuit which reduces parasitic capacitance between source and drain regions of the transistor and the substrate, and improves performance of the integrated circuit.

As a method for manufacturing an SOI substrate, a hydrogen ion implantation separation method is known (e.g., see Reference 1: Japanese Published Patent Application No. 2000-124092). A hydrogen ion implantation separation method is a method in which the surface of a silicon wafer is irradiated with hydrogen ions to form a weakened layer at a predetermined depth from the surface of the wafer, a thin silicon layer (a semiconductor layer) which is thinner than the silicon wafer is separated by heat treatment or the like with the weakened layer used as a separation plane (a cleavage plane), and the thin silicon layer (the semiconductor layer) is attached and bonded to another silicon wafer. After an oxide film is formed over the surface of the semiconductor layer by heat treatment in an oxidizing atmosphere, it is necessary to remove the oxide film as well as the weakened layer remaining on the separation plane and then to perform heat treatment at 1000 to 1300° C. in a reducing atmosphere to increase bonding strength at an attachment interface.

Further, a semiconductor device in which a single-crystal semiconductor layer is formed over an insulating substrate such as a high heat-resistant glass substrate is disclosed (e.g., see Reference 2: Japanese Published Patent Application No. H11-163363). The semiconductor device has a structure in which the entire surface of the glass substrate is protected by an insulating silicon film and the thin single-crystal semiconductor layer obtained by the hydrogen ion implantation separation method is firmly fixed over the insulating silicon film.

Meanwhile, when strain is applied to a semiconductor layer, mobility can be considerably improved when a transistor is manufactured with the semiconductor layer used as an active layer compared to the case where a transistor is manufactured with a normal semiconductor layer used as an active layer (e.g., see Reference 3: IEDM Tech. Digest, 1994, pp. 373 to 376 and Reference 4: IEEE ELECTRON DEVICE LETTERS, VOL. 15, No. 10, 1994, pp. 402 to 405). For example, in an N-channel transistor, when a semiconductor layer to which tensile strain is applied is used as an active layer, electron mobility can be considerably improved. On the other hand, in a P-channel transistor, when a semiconductor layer to which compressive strain is applied is used as an active layer, hole mobility can be considerably improved.

SUMMARY OF THE INVENTION

According to the disclosure in Reference 3 and Reference 4, as a method for applying tensile strain or compressive strain to a semiconductor layer, a method in which silicon germanium layers having different lattice constants are formed over a base film and a silicon layer is grown thereover to apply tensile strain, a method in which compressive strain of a silicon germanium layers are directly utilized, and the like have been proposed. However, since a semiconductor layer having favorable crystallinity cannot be obtained when such a step is performed at a process temperature equal to or lower than a strain point of glass or the like, it has been difficult to employ the above-described process for a display device or the like in which a substrate needs light-transmitting properties.

In view of the foregoing problems, the present invention provides a semiconductor device in which a semiconductor layer having favorable crystallinity and having tensile strain or compressive strain is efficiently and surely formed over an insulating substrate formed using glass, plastic, or the like, and a manufacturing method thereof.

In order to solve the foregoing problems, methods as described below are taken in the present invention.

A semiconductor device of the present invention includes a first circuit group and a second circuit group provided over a base substrate having an insulating surface. The first circuit group includes a first transistor having a first single-crystal semiconductor layer as an active layer. The second circuit group includes a second transistor having a second single-crystal semiconductor layer as an active layer. A bonding layer is provided between each of the first single-crystal semiconductor layer and the second single-crystal semiconductor layer and the base substrate having an insulating surface. The second single-crystal semiconductor layer is a single-crystal silicon layer having compressive strain.

A semiconductor device of the present invention includes a first circuit group and a second circuit group provided over a base substrate having an insulating surface. The first circuit group includes a first transistor having a first single-crystal semiconductor layer as an active layer. The second circuit group includes a second transistor having a second single-crystal semiconductor layer as an active layer. A bonding layer is provided between each of the first single-crystal semiconductor layer and the second single-crystal semiconductor layer is provided and the base substrate having an insulating surface. The first single-crystal semiconductor layer is a single-crystal silicon layer having tensile strain. The second single-crystal semiconductor layer is a single-crystal silicon layer having compressive strain.

In a semiconductor device of the present invention, it is preferable that the first circuit group include at least one of a data driver, a scan driver, and a logic circuit of a display device, and the second circuit group include a pixel portion of the display device.

In a semiconductor device of the present invention, the pixel portion of the display device may include an EL element and the second transistor may be a transistor controlling supply of current to the EL element. Alternatively, the pixel portion of the display device may include a liquid crystal element and the second transistor may be a transistor controlling application of voltage to the liquid crystal element.

A method for manufacturing a semiconductor device of the present invention includes the following steps: irradiating the surface of a semiconductor substrate with an ion to form a weakened layer (a separation layer) inside the semiconductor substrate; separating a single-crystal semiconductor layer from the semiconductor substrate with the weakened layer used as a separation surface; bonding the single-crystal semiconductor layer over a base substrate with a bonding layer interposed therebetween; and generating heat shrink by heat treatment of the base substrate to generate compressive strain in the single-crystal semiconductor layer.

A method for manufacturing a semiconductor device of the present invention includes the following steps: irradiating the surface of a semiconductor substrate with an ion to form a weakened layer (a separation layer) inside the semiconductor substrate; separating a single-crystal semiconductor layer from the semiconductor substrate with the weakened layer used as a separation surface; bonding the single-crystal semiconductor layer over a base substrate with a bonding layer interposed therebetween; and bonding a single-crystal semiconductor layer having tensile strain over the base substrate with the bonding layer interposed between after generating heat shrink by heat treatment of the base substrate to generate compressive strain in the single-crystal semiconductor layer.

As the bonding layer, a silicon oxide film or the like formed using an organic silane gas by a chemical vapor deposition method is typically used.

In addition, in order to use the present invention for a display device, the base substrate is preferably formed using a light-transmitting material.

In a semiconductor device manufactured according to the present invention, a transistor using a single-crystal semiconductor layer as an active layer and a transistor using a single-crystal semiconductor layer having compressive strain as an active layer are formed over the same insulating substrate formed using glass, plastic, or the like.

Alternatively, in a semiconductor device manufactured according to the present invention, a transistor using a single-crystal semiconductor layer having tensile strain as an active layer and a transistor using a single-crystal semiconductor layer having compressive strain as an active layer are formed over the same insulating substrate formed using glass, plastic, or the like.

Polarities of transistors which lead to improvement in mobility are different between the case where tensile strain is applied to a semiconductor layer and the case where compressive strain is applied to a semiconductor layer. In a conventional process, only either tensile strain or compressive strain can be applied to a semiconductor layer formed over a substrate, whereas a semiconductor layer to which appropriate strain is applied by the present invention can be formed in a desired region in an attachment step. In addition, in accordance with procedures in which after a single-crystal semiconductor layer is bonded to a base substrate, heat shrink is generated by heat treatment of the substrate and compressive strain is applied to the bonded single-crystal semiconductor layer, and then a single-crystal semiconductor layer having tensile strain, which is separately formed over a semiconductor substrate, is bonded over the base substrate, it is a great advantage that the heat shrink of the base substrate does not affect the single-crystal semiconductor layer having tensile strain.

In addition, as for general effects of stress, when a film formed over a substrate expands, "a warp" is generated on the substrate, whereas when the film formed over the substrate contracts, "a warp" having a reversed convex direction is generated. On the other hand, in the present invention, when an insulating substrate formed using glass, plastic, or the like, which generates heat shrink or the like with relative ease, is used as the base substrate, heat shrink force on the base substrate side is actively applied to a single-crystal semiconductor layer which is bonded to a layer formed above to generate compressive strain for the single-crystal semiconductor layer.

Further, the step of applying compressive strain to the semiconductor layer is a step utilizing part of shrink by heat treatment of the substrate, which has been performed conventionally, without adding any new step, and can be realized extremely easily, which is a great advantage.

Therefore, when a transistor in which an effect of improvement in mobility can be obtained by using compressive strain and a transistor in which an effect of improvement in mobility can be obtained by using tensile strain are used, a semiconductor device which can perform operations more efficiently at high speed is provided.

DETAILED DESCRIPTION OF THE INVENTION

Figure 1A:
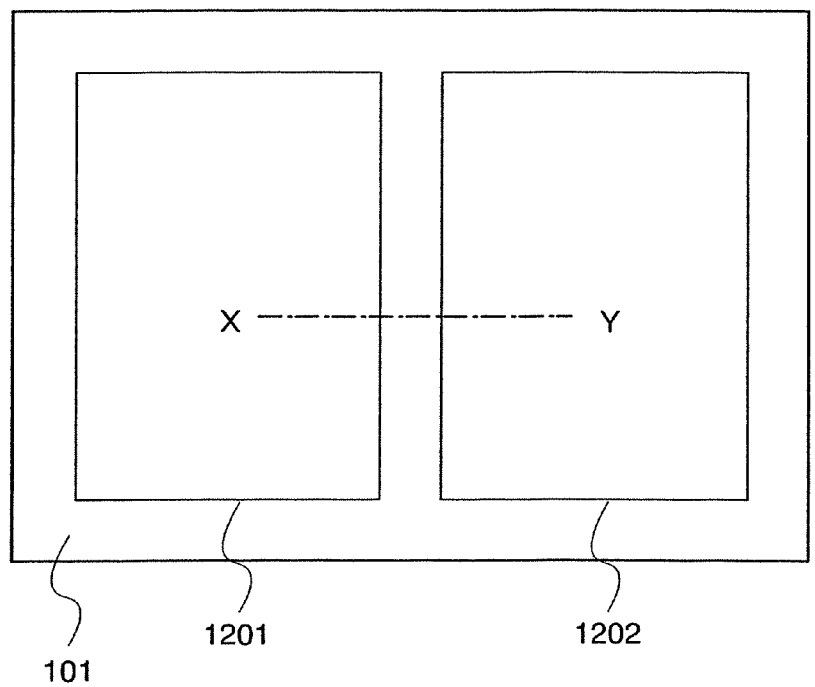
FIG. 1A illustrates a plane outline of a semiconductor device of the present invention.

Hereinafter, embodiment modes of the present invention will be described with reference to the drawings. Note that the present invention is not limited to the following description. The present invention can be implemented in various different ways and it will be readily appreciated by those skilled in the art that various changes and modifications are possible without departing from the spirit and the scope of the present invention. Therefore, the present invention should not be construed as being limited to the following description of the embodiment modes. Note that in structures of the present invention described hereinafter, like portions or portions having similar functions are denoted by the same reference numerals in different drawings, and description thereof is not repeated.

Embodiment Mode 1

A method for manufacturing a semiconductor device of the present invention is described with reference to FIGS. 1A to 6C.

A method for providing a single-crystal semiconductor layer over a substrate having an insulating surface is described with reference to FIGS. 2A to 2E and FIGS. 3A to 3D.

Figure 2A:
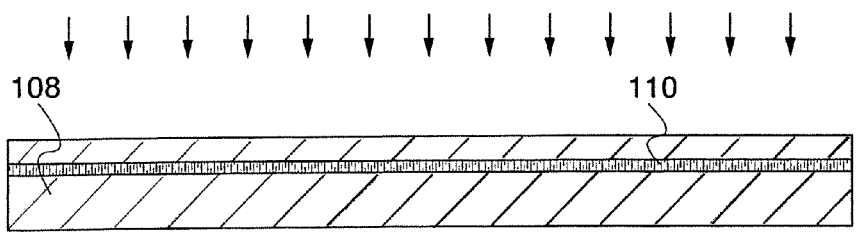
FIGS. 2A to 2E illustrate manufacturing steps of a semiconductor device of the present invention.

A semiconductor substrate 108 shown in FIG. 2A is cleaned, and ions which are accelerated by an electric field are introduced into the semiconductor substrate 108 from the surface thereof to reach a predetermined depth to form a weakened layer (a separation layer) 110. Ion irradiation is performed in consideration of the thickness of a single-crystal semiconductor layer which is formed over a base substrate. The thickness of the single-crystal semiconductor layer is preferably equal to or greater than 1 μm and equal to or less than 3 μm. Accelerating voltage for irradiating the semiconductor substrate 108 with ions is set in consideration of such a thickness.

A p-type or n-type single-crystal silicon substrate (silicon wafer) is typically used as the semiconductor substrate 108. Alternatively, a substrate of silicon or germanium, or a substrate of a compound semiconductor such as gallium arsenide or indium phosphide can be used as another single-crystal semiconductor substrate. Although a method in which a single-crystal semiconductor substrate is irradiated with ions of hydrogen or fluorine to reach a predetermined depth and then heat treatment is performed to separate a surface layer of a single-crystal silicon layer is used in this embodiment mode, a method in which epitaxial growth of single-crystal silicon is performed over a porous silicon layer and then the porous silicon layer is separated by water jet may be used.

The weakened layer 110 is formed by introducing ions of hydrogen, helium, or halogen typified by fluorine into the semiconductor substrate 108 by an ion-doping method or an ion implantation method. In the case of irradiating the semiconductor substrate 108 with fluorine ions as halogen, $BF_3$ may be used as a source gas. Note that an ion implantation method refers to a method in which an ionized gas is separated by mass to introduce desired ions into a semiconductor layer.

In the case where halogen ions such as fluorine ions are introduced into the semiconductor substrate (e.g., single-crystal silicon substrate) 108, introduced fluorine knocks out (expels) silicon atoms in a crystal lattice of silicon to effectively form a vacant portion, so that a minute void is formed in the weakened layer 110. In this case, the volume of the minute void formed in the weakened layer 110 is changed by heat treatment at relatively low temperature, and a thin single-crystal semiconductor layer can be formed by separation along the weakened layer 110. After irradiation with fluorine ions, irradiation with hydrogen ions may be performed so that hydrogen is contained in the void. It is preferable to effectively utilize the action of fluorine ions and hydrogen ions in such a manner because the weakened layer 110 which is formed to separate a thin semiconductor layer from the semiconductor substrate 108 utilizes change in the volume of the minute void formed in the weakened layer 110.

Alternatively, irradiation with one kind of ions or plural kinds of ions of different mass numbers consisting of a single kind of atoms may be performed. For example, in the case of irradiating with hydrogen ions, the hydrogen ions preferably include $H^+$, $H_2^+$, and $H_3^+$ ions with a high proportion of $H_3^+$ ions. With a high proportion of $H_3^+$ ions, irradiation efficiency can be increased and irradiation time can be shortened. With such a structure, separation can be easily performed.

Since it is necessary to perform irradiation with ions at a high dose in formation of the weakened layer 110, the surface of the semiconductor substrate 108 is roughened in some cases. Therefore, a protective film against irradiation with ions may be provided on a surface with which ions are irradiated by using a silicon nitride layer, a silicon nitride oxide layer, or the like with a thickness of 50 to 200 nm.

Alternatively, before formation of the weakened layer 110, cleaning may be performed on the semiconductor substrate 108 and an oxide film on the surface of the semiconductor substrate 108 may be removed to perform thermal oxidation. As thermal oxidation, general dry oxidation may be performed; however, oxidation in an oxidizing atmosphere to which halogen is added is preferably performed. For example, heat treatment is performed at a temperature of higher than or equal to 700° C. in an atmosphere containing HCl by 0.5 to 10 volume % (preferably 3 volume %) with respect to oxygen. The heat oxidation is preferably performed at a temperature of 950 to 1100° C. Processing time may be 0.1 to 6 hours, preferably 0.5 to 1 hour. The film thickness of an oxide film which is to be formed is 10 to 1000 nm (preferably 50 to 200 nm), for example, 100 nm.

As well as HCl, one or a plurality of kinds selected from HF, $NF_3$, HBr, $Cl_2$, $ClF_3$, $BCl_3$, $F_2$, Br), or the like can be used as a compound containing halogen.

When heat treatment is performed within such a temperature range, a gettering effect by halogen can be obtained. Gettering particularly has an effect of removing a metal impurity. That is, an impurity such as metal turns into a volatile chloride, and then is diffused into a gas phase to be removed by the action of chlorine. The above-described heat treatment is effective for the semiconductor substrate 108, the surface of which is treated with chemical mechanical polishing (CMP). Further, hydrogen has an effect of compensating defects at an interface between the semiconductor substrate 108 and the oxide film which is to be formed so as to reduce localized level density of the interface, so that the interface between the semiconductor substrate 108 and the oxide film is inactivated, so that electric characteristics are stabilized.

The oxide film formed by this heat treatment can contain halogen. When halogen is contained at a concentration of $1 \times 10^{17}$ to $5 \times 10^{20}/cm^3$, the oxide film can have a function as a protective film which captures an impurity such as metal and prevents contamination of the semiconductor substrate 108.

Figure 2B:
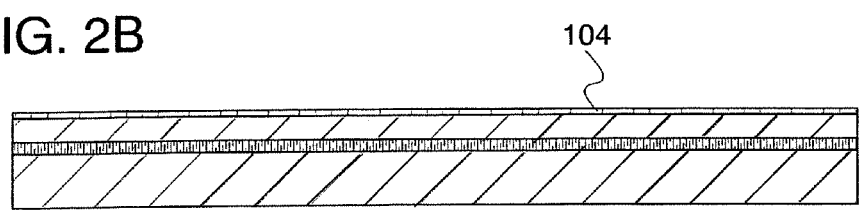

Next, as shown in FIG. 2B, a silicon oxide film is formed as a bonding layer 104 on the surface of the semiconductor substrate 108, which forms a bond with a base substrate 101. As the silicon oxide film, a silicon oxide film formed using an organic silane gas by a chemical vapor deposition method is preferable. Alternatively, a silicon oxide film formed using a silane gas by a chemical vapor deposition method can be used. Film formation by a chemical vapor deposition method is performed at a temperature of, for example, 100 to 400° C., preferably 200 to 350° C., at which degassing of the weakened layer 110 which is formed in the single-crystal semiconductor substrate 108 does not occur. Heat treatment for separating a single-crystal semiconductor layer 102 from the semiconductor substrate 108 is performed at a higher heat treatment temperature (e.g., a temperature of 400 to 600° C.) than temperature for film formation.

The bonding layer 104 has a smooth surface and forms a hydrophilic surface. A silicon oxide film is suitable for the bonding layer 104. In particular, a silicon oxide film formed using an organic silane gas by a chemical vapor deposition method is preferable. As an organic silane gas, a silicon-containing compound such as tetraethoxysilane (TEOS) (chemical formula: $Si(OC_2H_5)_4$), trimethylsilane (TMS) (chemical formula: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used. Alternatively, a silicon oxide film formed using a silane gas by a chemical vapor deposition method can be used.

The bonding layer 104 which has a smooth surface and forms a hydrophilic surface is provided with a thickness of 5 to 500 nm. With such a thickness, roughness of a surface on which the bonding layer 104 is formed can be smoothed and smoothness of a growth surface of the film can be ensured. Further, distortion between the single-crystal semiconductor layer 102 and a substrate which are bonded to each other can be reduced. The base substrate 101 may be provided with a similar silicon oxide film. That is, when the single-crystal semiconductor layer 102 is bonded to the base substrate 101, the single-crystal semiconductor layer 102 and the base substrate 101 can be firmly bonded to each other when the bonding layer 104 formed of a silicon oxide layer which is preferably formed using organic silane as a material is provided on either one or both surfaces of the base substrate 101 and the single-crystal semiconductor layer 102 which are to be bonded.

Figure 2C:
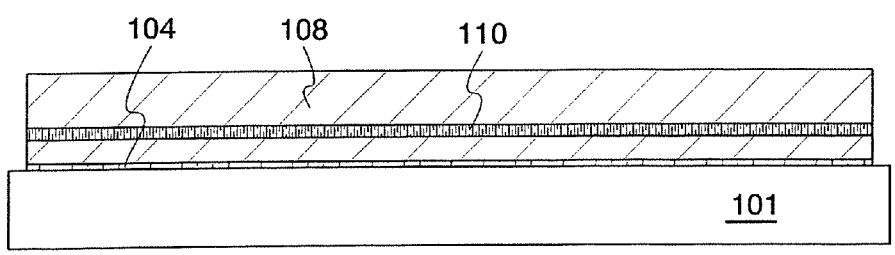

FIG. 2C shows a mode in which a surface of the base substrate 101 and a surface of the semiconductor substrate 108, on which the bonding layer 104 is formed, are disposed in contact to be bonded to each other. The surfaces which are to be bonded are cleaned sufficiently. Then, when the base substrate 101 and the bonding layer 104 are disposed in contact, a bond is formed. This bond is formed by Van der Waals force. When the base substrate 101 and the semiconductor substrate 108 are pressed against each other, a stronger bond can be formed by hydrogen bonding.

In order to form a favorable bond, the surfaces which are to form a bond may be activated. For example, the surfaces which are to form a bond are irradiated with an atomic beam or an ion beam. When an atomic beam or an ion beam is used, an inert gas neutral atom beam or inert gas ion beam of argon or the like can be used. Alternatively, plasma irradiation or radical treatment may be performed. With such a surface treatment, a bond between different kinds of materials can be easily formed even at a temperature of 200 to 400° C.

A step of separating the single-crystal semiconductor layer 102 from the semiconductor substrate 108 and a step of bonding the base substrate 101 and the single-crystal semiconductor layer 102 firmly may be performed by separate heat treatments or may be simultaneously performed by one heat treatment.

After the base substrate 101 and the semiconductor substrate 108 are bonded to each other with the bonding layer 104 interposed therebetween, heat treatment or pressure treatment is preferably performed. When heat treatment or pressure treatment is performed, bonding strength can be increased. Pressure treatment is performed so that pressure is applied in a perpendicular direction to the bonded surface, in consideration of pressure resistance of the base substrate 101 and the semiconductor substrate 108.

Figure 2D:
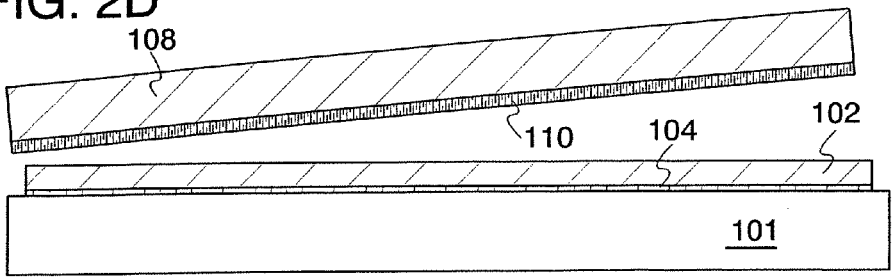

Subsequently, in FIG. 2D, heat treatment is performed to separate the semiconductor substrate 108 from the base substrate 101 with part of the weakened layer 110 used as a separation plane. For example, when heat treatment is performed at 400 to 600° C., the volume of minute voids formed in the weakened layer 110 is changed, so that separation can be performed along the weakened layer 110. The heat treatment is preferably performed at a temperature lower than the temperature at which heat treatment is performed on the base substrate 101 in advance. Since the bonding layer 104 is bonded to the base substrate 101, the single-crystal semiconductor layer 102 having the same crystallinity as the semiconductor substrate 108 remains over the base substrate 101.

Figure 2E:
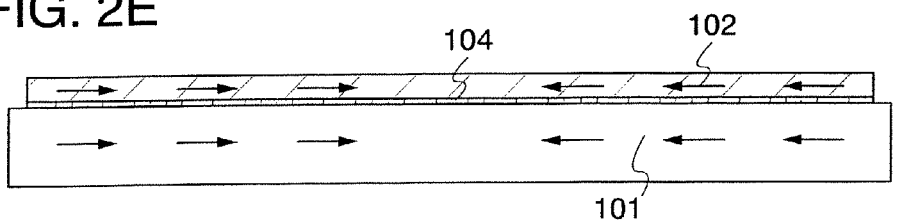

Further, as shown in FIG. 2E, heat treatment is performed on the base substrate 101 to which the single-crystal semiconductor layer 102 is bonded. The heat treatment at this time is preferably performed at a temperature lower than the temperature at which heat treatment is performed on the base substrate 101 in advance and higher than the temperature of the heat treatment at the time of separation. With this heat treatment, the base substrate 101 slightly generates heat shrink and applies compressive strain to the single-crystal semiconductor layer 102 bonded over the base substrate 101.

At this time, in the case where the temperature of the heat treatment is too high, when the base substrate 101 excessively generates heat shrink, the single-crystal semiconductor layer 102 is separated from the base substrate 101 at the bonded surface or a peripheral interface in some cases. Therefore, the temperature of the heat treatment is preferably adjusted as appropriate in accordance with a material of the base substrate.

Figure 3A:
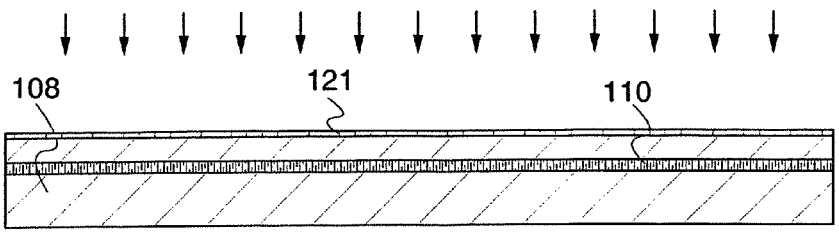
FIGS. 3A to 3D illustrate manufacturing steps of a semiconductor device of the present invention.

Next, steps of forming a single-crystal semiconductor layer with a bonding layer provided on the base substrate side are described with reference to FIGS. 3A to 3D. FIG. 3A shows a step in which the semiconductor substrate 108 provided with a silicon oxide film 121 is irradiated with ions which are accelerated by an electric field to reach a predetermined depth to form the weakened layer 110. Ion irradiation is similar to that shown in FIG. 2A. When the silicon oxide film 121 is formed on the surface of the semiconductor substrate 108, the surface can be prevented from being damaged and from losing smoothness due to ion irradiation. Further, the silicon oxide film 121 has an effect of preventing diffusion of impurities against the single-crystal semiconductor layer 102 which is formed of the semiconductor substrate 108.

Figure 3B:
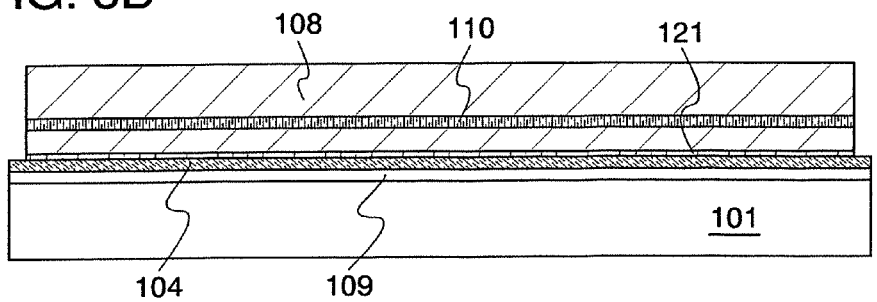

FIG. 3B shows a step in which the base substrate 101, over which a blocking layer 109 and the bonding layer 104 are formed, and a surface of the semiconductor substrate 108, on which the silicon oxide film 121 formed, are disposed in contact with each other to be bonded. When the bonding layer 104 over the base substrate 101 and the silicon oxide film 121 of the semiconductor substrate 108 are disposed in contact with each other, a bond is formed.

Figure 3C:
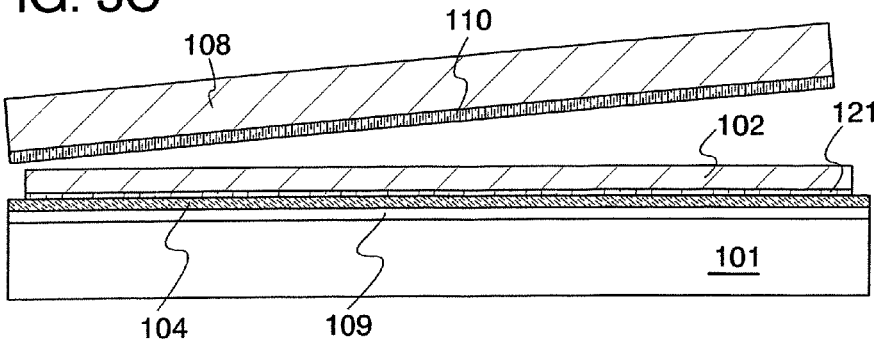

After that, the semiconductor substrate 108 is separated, as shown in FIG. 3C. Heat treatment for separating the single-crystal semiconductor layer 102 is performed in a manner similar to that shown in FIG. 2D. The heat treatment in a bonding-separating process is performed at a temperature lower than or equal to the temperature at which the heat treatment is performed on the base substrate 101 in advance. Thus, the semiconductor substrate shown in FIG. 3C can be obtained.

Figure 3D:
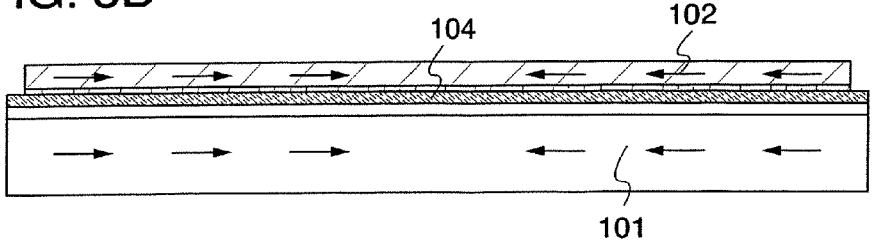

Further, as shown in FIG. 3D, heat treatment is performed on the base substrate 101 to which the single-crystal semiconductor layer 102 is bonded. The heat treatment at this time is preferably performed at a temperature lower than the temperature at which heat treatment is performed on the base substrate 101 in advance and higher than the temperature of the heat treatment at the time of separation. With this heat treatment, the base substrate 101 slightly generates heat shrink and applies compressive strain to the single-crystal semiconductor layer 102 bonded over the base substrate 101.

At this time, in the case where the temperature of the heat treatment is too high, when the base substrate 101 excessively generates heat shrink, the single-crystal semiconductor layer 102 is separated from the base substrate 101 at the bonded surface or a peripheral interface in some cases. Therefore, the temperature of the heat treatment is preferably adjusted as appropriate in accordance with a material of the base substrate.

In FIGS. 2A to 3D, a substrate having an insulating surface can be used as the base substrate 101. For example, any of various glass substrates which are used in the electronics industry and referred to as non-alkali glass substrates, such as aluminoborosilicate glass substrates, aluminosilicate glass substrates, and barium borosilicate glass substrates can be used. Alternatively, a quartz substrate may be used. A substrate having a suitable transition point may be used in accordance with the temperature of the heat treatment. When manufacturing steps of a single-crystal semiconductor layer are performed more than once in accordance with the above-described steps, a single-crystal semiconductor layer can be formed over a large substrate which is longer than one meter on a side. Further, when heat shrink in accordance with the heat treatment of the substrate is applied, compressive strain can be applied to the single-crystal semiconductor layer transferred over the substrate.

Further, after the single-crystal semiconductor layer is once transferred and compressive strain is applied to the single-crystal semiconductor layer by the heat treatment of the substrate, a different single-crystal semiconductor layer is further formed, so that a normal single-crystal semiconductor layer and a single-crystal semiconductor layer to which compressive strain is applied can be formed over the same substrate.

Meanwhile, after the single-crystal semiconductor layer is once formed and compressive strain is applied to the single-crystal semiconductor layer by the heat treatment of the substrate, a substrate where a single-crystal semiconductor layer having tensile strain is grown over a silicon germanium layer having reduced stress, which is provided over the semiconductor substrate, so that a single-crystal semiconductor layer having tensile strain and a single-crystal semiconductor layer to which compressive strain is applied can be formed over the same substrate.

After the normal single-crystal semiconductor layer and the single-crystal semiconductor layer having tensile strain as described above are formed, it is preferable to avoid heat treatment at a temperature which exceeds heating temperature at the time of applying compressive strain. Note that even when such a heat treatment is performed, compressive strain is applied to the normal single-crystal semiconductor layer and the single-crystal semiconductor layer having tensile strain, which does not become a major problem because an adverse effect thereof is negligible.

Note that conditions and the like of a step in which the single-crystal semiconductor layer having tensile strain is grown over the silicon germanium layer having reduced stress by utilizing difference of lattice constants are not particularly limited to certain conditions in the present invention.

Subsequently, a process of forming a transistor by using the single-crystal semiconductor layers formed over the base substrate 101 to form a circuit is described.

Figure 4A:
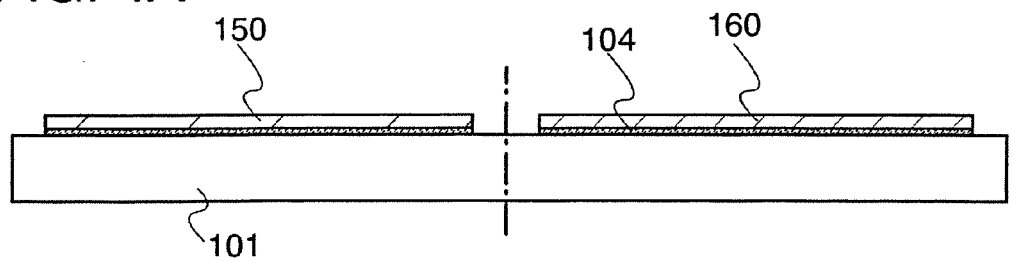
FIGS. 4A to 4D illustrate manufacturing steps of a semiconductor device of the present invention.
Figure 4B:
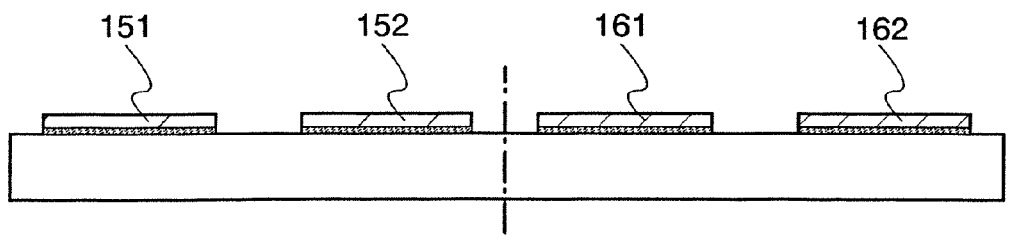

As shown in FIG. 4A, after a single-crystal semiconductor layer 150 and a single-crystal semiconductor layer 160 having compressive strain are formed over the base substrate 101 with the bonding layer 104 interposed therebetween in accordance with the above-described process, a resist pattern having a desired shape is formed by using a photomask, and island-shaped semiconductor layers 151, 152, 161, and 162 are formed by processing using photolithography, as shown in FIG. 4B.

Further, end portions of the semiconductor layers 151, 152, 161, and 162 are each formed to have a tilt angle (a taper angle). The reason for forming each of the end portions of the semiconductor layers 151, 152, 161, and 162 to have a taper angle is that an advantageous effect of improving coverage of a semiconductor layer of an insulating film which is formed later can be expected, for example. Note that in the case where this taper angle is small, a parasitic transistor whose characteristics are different from those of a center portion of each of the semiconductor layers 151, 152, 161, and 162 is formed in a taper region in some cases. In order to prevent an adverse effect of the parasitic transistor, the taper angle is preferably large. Therefore, it is preferable that the taper angle be approximately 45 to 90 degrees.

Note that in this specification, "an end portion" of the semiconductor layer corresponds to an edge portion of the semiconductor layer formed to have an island shape. "A side surface" of the semiconductor layer corresponds to the surface of the edge portion.

As for an etching process, either plasma etching (dry etching) or wet etching may be employed. In the case of processing a large substrate, plasma etching is suitable. As an etching gas, a fluorine-based gas such as $CF_4$ or $NF_3$ or a chlorine-based gas such as $Cl_2$ or $BCl_3$ is used, and an inert gas such as He or Ar may be added to the etching gas as appropriate. When an etching process using an atmospheric discharge is employed, local discharge process is also possible, and it is not necessary to form a mask over the entire surface of the substrate.

In the present invention, a conductive layer for forming a wiring layer or an electrode layer, a mask for forming a predetermined pattern, or the like may be formed by a method in which a pattern can be formed as selected, such as a droplet discharge method. By a droplet discharge (jetting) method (also referred to as an ink-jet method depending on its system), a droplet of a composition which is mixed for a particular purpose is discharged (jetted) as selected, so that a predetermined pattern (such as a conductive layer or an insulating layer) can be formed. At this time, treatment for controlling wettability or adhesion may be separately performed on a region where the pattern is fin med. Alternatively, a method in which a pattern can be transferred or drawn, for example, a printing method (a method for forming patterns, such as screen printing or offset printing), or the like can be used.

A mask used in this embodiment mode is formed using a resin material such as an epoxy resin, an acrylic resin, a phenol resin, a novolac resin, a melamine resin, or a urethane resin. Alternatively, an organic material such as benzocyclobutene, parylene, fluorinated arylene ether, or polyimide having light-transmitting properties; a compound material formed by polymerization of a siloxane-based polymer or the like; a composition material containing a soluble homopolymer and a copolymer; or the like can be used. Further alternatively, a commercial resist material containing a photosensitizer may be used. For example, a positive resist or a negative resist may be used. In the case of using a droplet discharge method, even when any of the above-described materials is used, surface tension and viscosity are adjusted as appropriate by, for example, adjusting concentration of a solvent or adding a surfactant or the like.

Figure 4C:
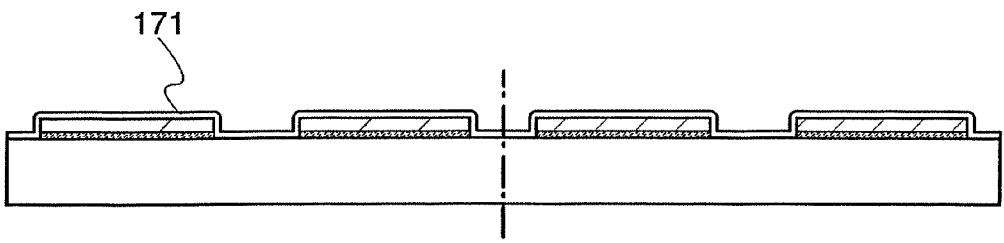

Subsequently, as shown in FIG. 4C, a gate insulating film 171 is formed to cover the surfaces and the end portions of the semiconductor layers 151, 152, 161, and 162 sufficiently. Preferably, when the thickness of the insulating film in a region which is in contact with the side surfaces of the semiconductor layers 151, 152, 161, and 162 is increased, electric field concentration at the end portions of the semiconductor layers 151, 152, 161, and 162 can be relieved, so that generation of leakage current, or the like can be prevented.

As the gate insulating film 171, an insulating film may be formed by plasma CVD, sputtering, or the like. In this embodiment mode, the thickness of the gate insulating film may be 1 to 150 nm, more preferably, approximately 10 to 80 nm.

Figure 4D:
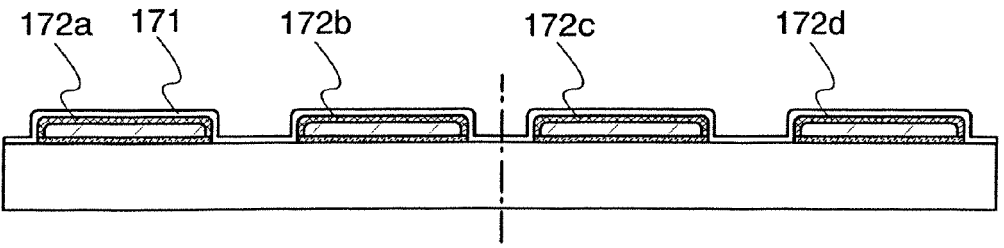

The gate insulating film 171 may be formed using a silicon oxide film or may be formed to have a stacked-layer structure of a silicon oxide film and a silicon nitride film. The gate insulating film 171 may be formed by stacking insulating films by plasma CVD or low-pressure CVD, or may be formed by solid-phase oxidation or solid-phase nitridation using plasma treatment. Alternatively, as shown in FIG. 4D, after performing self-oxidation of the surfaces of the semiconductor layers 151, 152, 161, and 162 to form gate insulating films 172a to 172d, the gate insulating film 171 may be formed to have a stacked-layer structure. The insulating films formed by self-oxidation of the surface of the semiconductor layers are dense, have high withstand voltage, and are highly reliable.

In the case of forming the gate insulating films through the above-described step, coverage of the surfaces of the semiconductor layers 151, 152, 161, and 162 is naturally favorable. Therefore, formation of the taper angles at the end portions of the semiconductor layers 151, 152, 161, and 162 as described above is not necessarily performed.

For solid-phase oxidation or solid-phase nitridation by plasma treatment, it is preferable to use plasma excited by a microwave (typically 2.45 GHz) at an electron density of $1 \times 10^{11}$ to $1 \times 10^{13}/cm^3$ and at an electron temperature of 0.5 to 1.5 eV. This is to form a dense insulating film and to obtain a practical reaction rate in solid-phase oxidation or solid-phase nitridation at a temperature lower than or equal to 500° C.

When the surface of the semiconductor layer is oxidized by this plasma treatment, the plasma treatment is performed in an oxygen atmosphere (e.g., in an atmosphere containing oxygen ($O_2$) or dinitrogen monoxide ($N_2O$) and a rare gas (containing at least one of He, Ne, Ar, Kr, or Xe) or in an atmosphere containing oxygen or dinitrogen monoxide, hydrogen ($H_2$) and a rare gas). Alternatively, when the surface of the semiconductor layer is nitrided by plasma treatment, the plasma treatment is performed in a nitrogen atmosphere (e.g., in an atmosphere containing nitrogen ($N_2$) and a rare gas, in an atmosphere containing nitrogen, hydrogen, and a rare gas, or in an atmosphere containing $NH_3$ and a rare gas).

Note that plasma treatment includes oxidation treatment, nitridation treatment, oxynitridation treatment, hydrogenation treatment, and surface modifying treatment on a semiconductor layer, an insulating layer, and a conductive layer. In each treatment, a gas to be supplied may be selected in accordance with its purpose.

The semiconductor layer may be subjected to oxidation treatment or nitridation treatment as follows. First, a treatment chamber is evacuated, and a plasma treatment gas containing oxygen or nitrogen is introduced from a gas supply portion. A substrate temperature is room temperature or is heated to a temperature of 100 to 500° C. by a temperature control portion.

Next, microwaves are supplied to an antenna from a microwave supply portion. Then, the microwaves are introduced into the treatment chamber from the antenna through a dielectric plate, so that plasma is generated. When plasma is excited with microwave introduction, plasma with a low electron temperature (lower than or equal to 3 eV, preferably lower than or equal to 1.5 eV) and high electron density (higher than or equal to $1 \times 10^{11}/cm^3$) can be generated. With oxygen radicals (which include OH radicals in some cases) and/or nitrogen radicals (which include NH radicals in some cases) generated by this high-density plasma, the surface of the semiconductor layer can be oxidized and/or nitrided. When a rare gas such as argon is mixed into the plasma treatment gas, oxygen radicals or nitrogen radicals can be efficiently generated by excited species of the rare gas. This method enables solid-phase oxidation, solid-phase nitridation, or solid-phase oxynitridation at a low temperature of lower than or equal to 500° C. by efficiently utilizing the active radicals excited with the plasma.

Through such a solid-phase oxidation treatment or solid-phase nitridation treatment by the plasma treatment as described above, an insulating layer similar to a thermal oxide film, which is formed at 950 to 1050° C., can be obtained even when a glass substrate having a temperature limit of lower than or equal to 700° C. is used. That is, a film having high reliability can be formed as a gate insulating film of a transistor.

Alternatively, for formation of the gate insulating film, a high dielectric constant material may be used. When a high dielectric constant material is used for the gate insulating film, gate leakage current can be reduced. As a typical high dielectric constant material, zirconium dioxide, hafnium oxide, titanium dioxide, tantalum pentoxide, or the like can be used. Further alternatively, a silicon oxide film may be formed by solid-phase oxidation by plasma treatment.

Alternatively, the surface of the semiconductor region can be oxidized by a GRTA method, an LRTA method, or the like to form a thermal oxide film, so that a thin silicon oxide film can be formed. Note that in order to form a dense insulating film having small gate leakage current at a low film formation temperature, a rare gas element such as argon is preferably contained in a reaction gas and mixed into an insulating film to be formed.

Subsequently, a first conductive film having a thickness of 20 to 100 nm and a second conductive film having a thickness of 100 to 400 mu which serve as gate electrode layers are stacked over the gate insulating film 171. The first conductive film and the second conductive film can be formed by sputtering, an evaporation method, CVD, or the like. The first conductive film and the second conductive film may be formed using an element selected from tantalum (Ta), tungsten (W), titanium (Ti), molybdenum (Mo), aluminum (Al), copper (Cu), chromium (Cr), or neodymium (Nd), or an alloy material or a compound material containing any of the above-described elements as a main component. Alternatively, a semiconductor film typified by a polycrystalline silicon film doped with an impurity element such as phosphorus, an AgP-dCu alloy, or the like may be used as the first conductive film and the second conductive film. The conductive films used as the gate electrode layer are not limited to having the stacked-layer structure as described above, and may have a single-layer structure. For example, a three-layer structure may be used in which a tungsten film with a thickness of 50 nm as a first conductive film, an aluminum-silicon alloy (Al—Si) film with a thickness of 500 nm as a second conductive film, and a titanium nitride film with a thickness of 30 nm as a third conductive film are sequentially stacked. In the case of the three-layer structure, tungsten nitride may be used instead of tungsten for the first conductive film; an aluminum-titanium alloy (Al—Ti) film may be used instead of an aluminum-silicon (Al—Si) alloy film for the second conductive film; or a titanium film may be used instead of a titanium nitride film for the third conductive film. In this embodiment mode, a tantalum nitride film with a thickness of 30 nm is formed as the first conductive film and tungsten (W) with a thickness of 370 nm is fowled as the second conductive film.

Figure 5A:
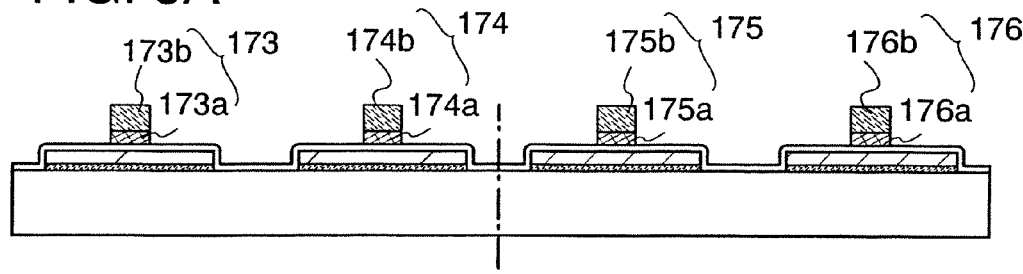
FIGS. 5A to 5D illustrate manufacturing steps of a semiconductor device of the present invention.
Figure 5B:
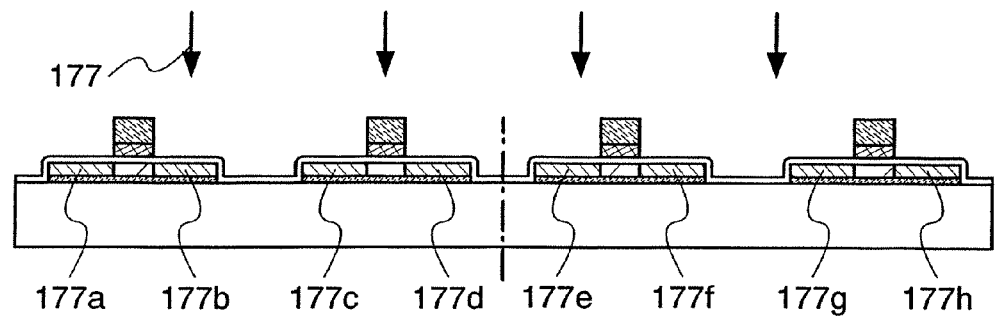
Figure 5C:
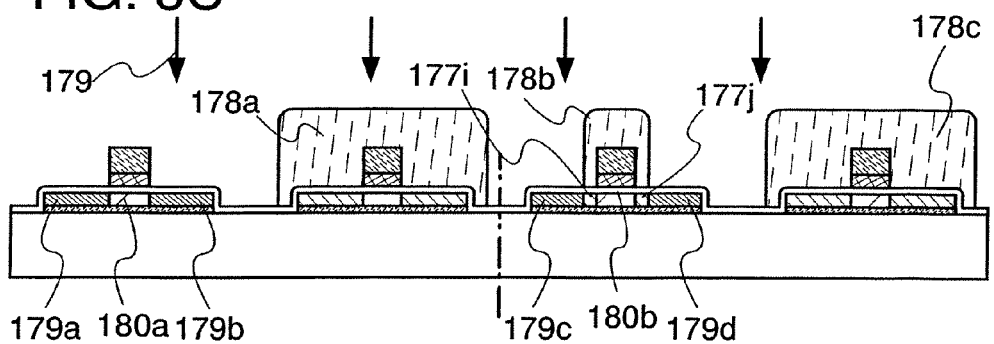
Figure 5D:
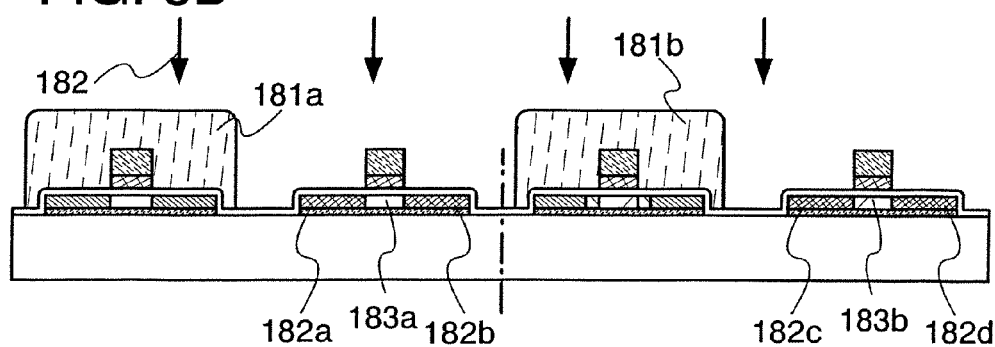

Next, the first conductive film and the second conductive film are processed into desired shapes to form gate electrodes 173 to 176 formed of stacked-layer structures of first gate electrode layers 173a, 174a, 175a, and 176a and second gate electrode layers 173b, 174b, 175b, and 176b, respectively (see FIG. 5A). The first gate electrode layers and the second gate electrode layers can be etched to have desired taper shapes by adjusting etching conditions (the amount of power applied to a coil electrode layer, an electrode temperature on the substrate side, and the like) as appropriate by ICP (inductively coupled plasma) etching. Further, angles and the like of the taper shapes can also be controlled by the shape of the mask. Note that as an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate.

In this embodiment mode, the example where the first gate electrode layer and the second gate electrode layer are formed to have perpendicular side surfaces is described; however, the present invention is not limited to this. Both the first gate electrode layer and the second gate electrode layer may be formed into tapered shapes, or one of the first gate electrode layer and the second gate electrode layer may be formed into a tapered shape and the other thereof may be formed to have a perpendicular side surface by anisotropic etching. In addition, the taper angles may be different between the stacked gate electrode layers or may be the same. With the tapered shape, coverage of a film which is stacked thereover is improved and defects are reduced, so that reliability is improved.

In addition, although not shown in FIG. 5A, the gate insulating film 171 is etched to some extent and reduced in thickness (so-called film reduction) in the etching step for forming the gate electrode layer in some cases.

Subsequently, an n-type impurity element 177 is added by using the gate electrodes 173 to 176 as masks. Thus, first impurity regions 177a to 177h are formed (see FIG. 5B). In this embodiment mode, doping is performed by using phosphine ($PH_3$) as a doping gas containing an impurity element (the doping gas is obtained by diluting $PH_3$ with hydrogen ($H_2$); a rate of $PH_3$ in the gas is 5%) under conditions that a gas flow rate is 80 sccm, beam current is 54 µA/cm, accelerating voltage is 50 kV, and dosage is $7.0\times10^{13}$ ions/cm$^2$. Here, addition is performed such that each of the first impurity regions 177a to 177h contains the n-type impurity element at a concentration of approximately $1\times10^{17}$ to $5\times10^{18}$/cm$^3$. In this embodiment mode, phosphorus (P) is used as the n-type impurity element.

Next, masks 178a to 178c which cover the semiconductor layer 152, part of the semiconductor layer 161, and the semiconductor layer 162, respectively, are formed. An n-type impurity element 179 is added by using the masks 178a to 178c and the gate electrode 173 as masks. Thus, second impurity regions 179a to 179d and third impurity regions 177i and 177j are formed. In this embodiment mode, doping is performed by using $PH_3$ as a doping gas containing an impurity element (the doping gas is obtained by diluting $PH_3$ with hydrogen ($H_2$); a rate of $PH_3$ in the gas is 5%) under conditions that a gas flow rate is 80 sccm, beam current is 540 µA/cm, accelerating voltage is 70 kV, and dosage is $5.0\times10^{15}$ ions/cm$^2$. Here, addition is performed such that each of the second impurity regions 179a to 179d contains the n-type impurity element at a concentration of approximately $5\times10^{19}$ to $5\times10^{20}$/cm$^3$. Further, a channel formation region 180a is formed in the semiconductor layer 151 and a channel formation region 180b is formed in the semiconductor layer 161 (see FIG. 5C).

The second impurity regions 179a to 179d are high-concentration n-type impurity regions and function as source regions and drain regions of n-channel transistors. On the other hand, the third impurity regions 177i and 177j are low-concentration n-type impurity regions and function as so-called LDD (lightly doped drain) regions. Further, since the third impurity regions 177i and 177j are formed in so-called offset regions, which are not covered with the gate electrode layers, the third impurity regions 177i and 177j have an effect of reducing off leakage current of a transistor. Accordingly, a highly reliable transistor at the time of high voltage application can be realized.

Subsequently, after the masks 178a to 178c which are described above are removed, masks 181a and 181b which cover the semiconductor layers 151 and 161, respectively, are formed. A p-type impurity element 182 is added by using the masks 181a and 181b and the gate electrodes 174 and 176 as masks. Thus, p-type impurity regions 182a to 182d are formed. Since boron (B) is used as a p-type impurity element in this embodiment mode, doping is performed by using diborane ($B_2H_6$) as a doping gas containing an impurity element (the doping gas is obtained by diluting $B_2H_6$ with hydrogen ($H_2$); a rate of $B_2H_6$ in the gas is 15%) under conditions that a gas flow rate is 70 sccm, beam current is 180 µA/cm, accelerating voltage is 80 kV, and dosage is $2.0\times10^{15}$ ions/cm$^2$. Here, addition is performed such that each of the p-type impurity regions 182a to 182d contains the p-type impurity element at a concentration of approximately $1\times10^{20}$ to $5\times10^{21}$/cm$^3$. Further, a channel formation region 183a is formed in the semiconductor layer 152 and a channel formation region 183b is formed in the semiconductor layer 162 (see FIG. 5D).

The p-type impurity regions 182a to 182d are high-concentration p-type impurity regions and function as source regions and drain regions of p-channel transistors.

Next, in order to activate the impurity element which is added to the semiconductor layers 151, 152, 161, and 162, heat treatment, intense light irradiation, or laser beam irradiation may be performed. At the same time as activation, plasma damage to the gate insulating layer and plasma damage to the interface between the gate insulating layer and the semiconductor layer can be recovered.

Figure 6A:
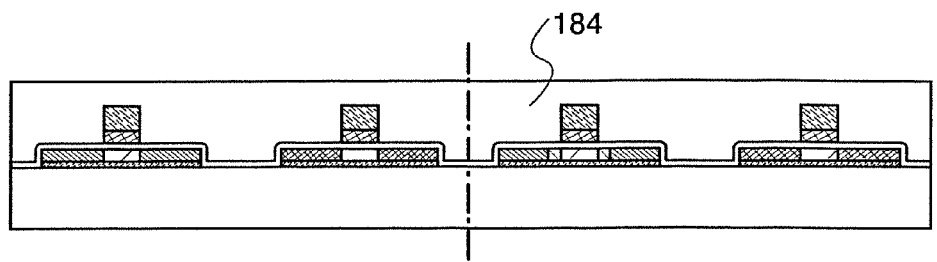
FIGS. 6A to 6C illustrate manufacturing steps of a semiconductor device of the present invention.
Figure 6B:
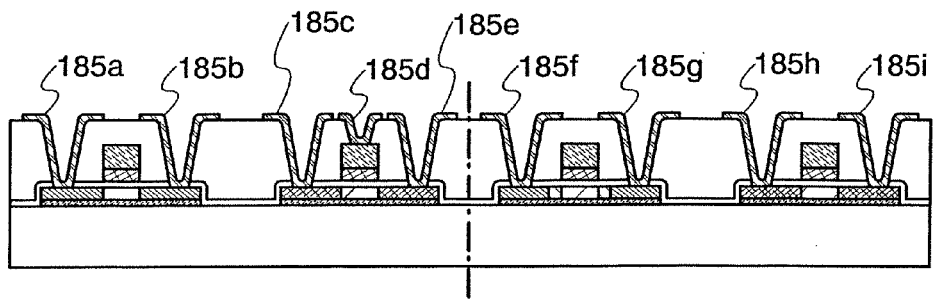

Subsequently, as shown in FIG. 6A, an interlayer insulating film covering the semiconductor layers and the gate electrodes is formed. In this embodiment mode, a single-layer structure of an interlayer insulating film 184 is shown. As the interlayer insulating film 184, a silicon nitride film, a silicon nitride oxide film, a silicon oxynitride film, a silicon oxide film, or the like which can be formed by sputtering or plasma CVD may be used. Alternatively a stacked-layer structure of two or more layers may be used.

Further, heat treatment is performed at 300 to 550° C. for 1 to 12 hours in a nitrogen atmosphere to hydrogenate the semiconductor layers. This heat treatment is preferably performed at 400 to 500° C. In this step, dangling bonds in the semiconductor layers are terminated by hydrogen contained in the interlayer insulating film 184. In this embodiment mode, heat treatment is performed at 410° C. for 1 hour.

The interlayer insulating film 184 can be formed using a material selected from aluminum nitride, aluminum oxynitride, aluminum nitride oxide containing more nitrogen than oxygen, aluminum oxide, diamond-like carbon (DLC), nitrogen-containing carbon (CN), or any other substance containing an inorganic insulating material. Alternatively, a siloxane resin may be used. A siloxane resin is a resin containing a Si—O—Si bond. The skeleton structure of siloxane is formed of a bond of silicon and oxygen. As a substituent, an organic group containing at least hydrogen (e.g., an alkyl group or aromatic hydrocarbon) is used. Alternatively, a fluoro group or a fluoro group and an organic group containing at least hydrogen may be used as the substituent. Alternatively, an organic insulating material may be used. As an organic material, polyimide, acrylic, polyamide, polyimide amide, resist, benzocyclobutene, polysilazane, or the like can be used. Alternatively, a coating film having favorable flatness, which is formed by a coating method, may be used.

The interlayer insulating film 184 can be formed by dipping, spray coating, coating with a variety of coaters, an evaporation method, or the like, as well as sputtering or plasma CVD, which is described above. Alternatively, the interlayer insulating film 184 may be formed by a droplet discharge method. In this case, a material solution can be saved. Alternatively, a method by which a pattern can be transferred or drawn, like a droplet discharge method, for example, a printing method (a method for forming a pattern, such as screen printing or offset printing), or the like can be used.

Subsequently, contact holes (opening portions) which reach the semiconductor layer and the gate electrode layer are formed in the interlayer insulating film and the gate insulating film by using a mask formed of a resist. Etching may be performed only once or a plurality of times depending on selectivity of the materials which are used. Further, either wet etching or dry etching may be performed, or both wet etching and dry etching may be performed. As an etchant of wet etching, it is preferable to use a solution containing fluorinated acid such as a mixed solution containing ammonium hydrogen fluoride and ammonium fluoride. As an etching gas, a chlorine-based gas typified by $Cl_2$, $BCl_3$, $SiCl_4$, or $CCl_4$; a fluorine-based gas typified by $CF_4$, $SF_6$, or $NF_3$; or $O_2$ can be used as appropriate. Further, an inert gas may be added to the etching gas. As the inert gas element which is added, one kind of element or a plurality of kinds of elements selected from He, Ne, Ar, Kr, or Xe can be used.

A conductive film is formed so as to cover the opening portion, and the conductive film is etched to have a desired shape, so that wirings 185a to 185i which are electrically connected to part of a source region or a drain region, or a gate electrode are formed. Alternatively, the wirings 185a to 185i may be formed by forming a conductive layer as selected at a predetermined position by a droplet discharge method, a printing method, an electrolytic plating method, or the like. Alternatively, a reflow method or a damascene method may be used. The wirings 185a to 185i are formed using a metal such as Ag, Au, Cu, Ni, Pt, Pd, Ir, Rh, W, Al, Ta, Mo, Cd, Zn, Fe, Ti, Zr, or Ba; Si; Ge; or an alloy or metal nitride thereof. Alternatively, a stacked-layer structure of any of these materials may be used. In this embodiment mode, a 60 nm-thick titanium (Ti) film, a 40 nm-titanium nitride film, a 700 nm-thick aluminum film, and a 200 nm-thick titanium (Ti) film are stacked and processed to have a desired shape (see FIG. 6B).

Figure 6C:
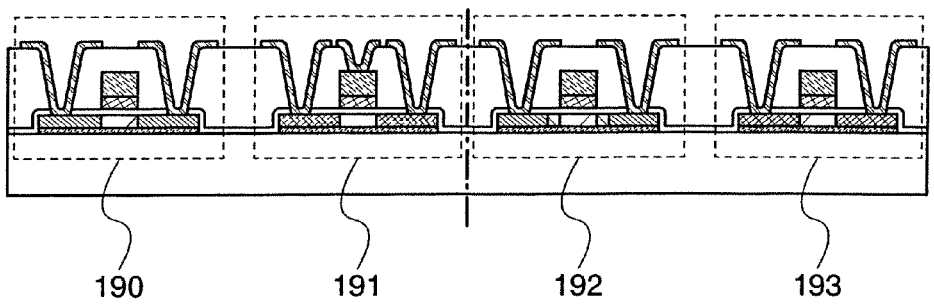

Through the above-described process, a semiconductor device is completed, which includes transistors 190 and 191 using semiconductor layers 151 and 152 as active layers, respectively, and transistors 192 and 193 using the single-crystal semiconductor layers 161 and 162 having compressive strain as active layers, respectively, over the same substrate (see FIG. 6C).

Figure 1B:
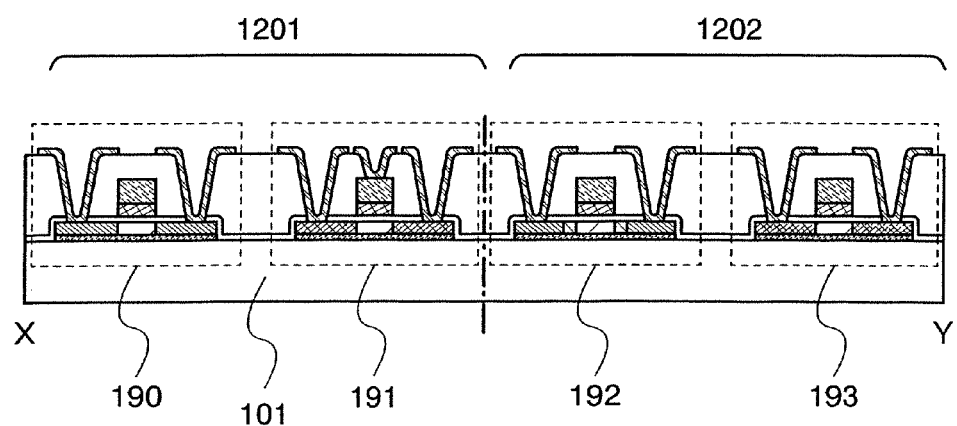
FIG. 1B illustrates a cross-sectional structure of a semiconductor device of the present invention.

FIGS. 1A and 1B show an example of a semiconductor device which is formed in accordance with this embodiment mode. FIG. 1A is a plan view of a semiconductor device of the present invention, and FIG. 1B is a cross-sectional view taken along X-Y in FIG. 1A.

As shown in FIGS. 1A and 1B, a first circuit group 1201 and a second circuit group 1202 are formed over the same base substrate 101. The first circuit group 1201 is formed using the transistors 190 and 191 which are formed using single-crystal semiconductor layers. The second circuit group 1202 is formed using the transistors 192 and 193 which are formed using single-crystal semiconductor layers having compressive strain.

Embodiment Mode 2

In this embodiment mode, an example of a semiconductor device having a display function, to which the present invention is applied, is described with reference to FIGS. 7A and 7B.

Figure 7A:
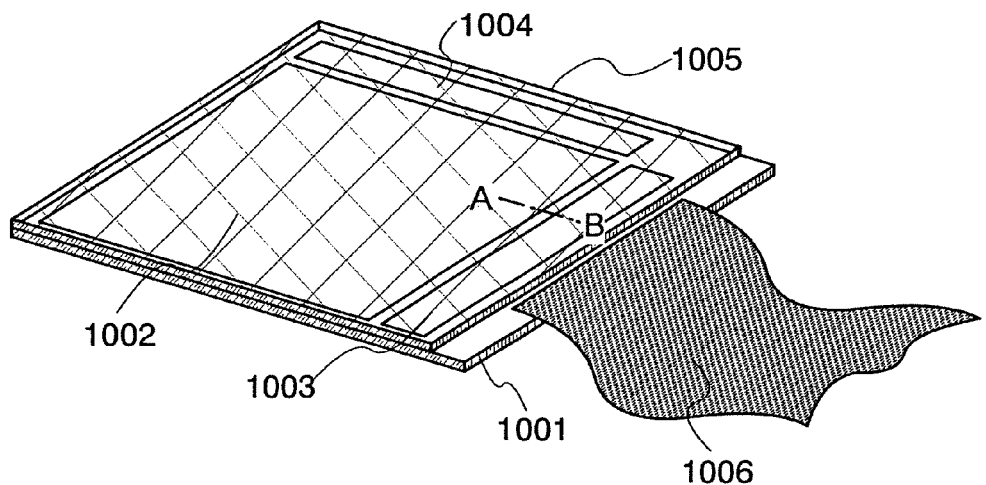
FIGS. 7A and 7B illustrate one mode of a semiconductor device of the present invention (an EL display device)

FIG. 7A shows an active matrix display device. A pixel portion 1002 where a plurality of pixel circuits are arranged in matrix, a data driver 1003, and a scan driver 1004 are formed over a base substrate 1001. Further, a top surface of the base substrate 1001 is hermetically sealed with a counter substrate (a sealing substrate) 1005. A control signal, an image signal, and driving power which are necessary for driving a display device are supplied from outside through a flexible printed circuit (FPC) 1006. In addition, FIG. 7B is a cross-sectional view taken along A-B in FIG. 7A.

Figure 7B:
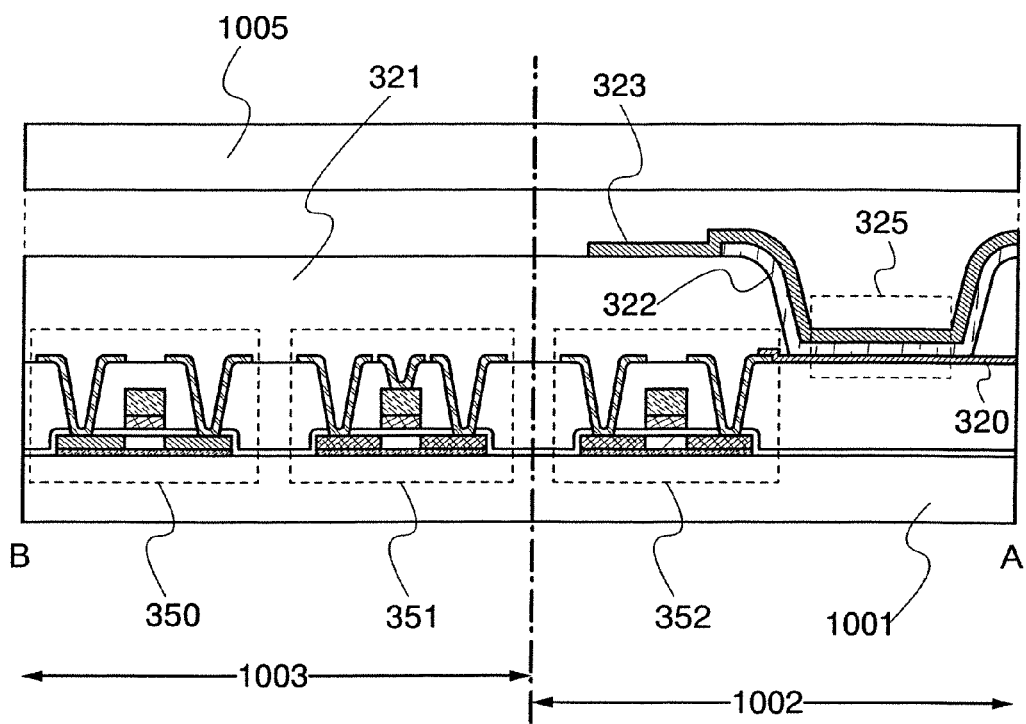

FIG. 7B shows a cross section of an active matrix display device when a pixel portion is formed using an electroluminescence (EL) element.

The data driver 1003 and the scan driver 1004 each perform processing for inputting an image signal supplied from outside to each pixel in accordance with a control signal supplied from outside, and the data driver 1003 and the scan driver 1004 each needs relatively high-speed operations in a display device.

In accordance with the present invention, the data driver 1003 and the scan driver 1004 are formed by using transistors 350 and 351 which are formed by using the single-crystal semiconductor layers, which are formed over the base substrate 1001 through the above-described process, as active layers. The transistors 350 and 351 have sufficient capability for driving the data driver 1003 and the scan driver 1004.

Note that when a display device is manufactured by applying the present invention, a light-transmitting substrate formed using glass, plastic, or the like is preferably used as the base substrate 1001. Needless to say, a material which can withstand the heat treatment through the above-described step should be selected.

Meanwhile, in the pixel portion 1002, images are displayed when current is supplied to the EL element provided for each pixel and the EL element emits light. Therefore, a transistor controlling supply of current to the EL element needs sufficient drive capability.

In accordance with the present invention, the pixel portion 1002 is formed by using a transistor 352 which is formed by using the single-crystal semiconductor layer having compressive strain, which is formed over the base substrate 1001 through the above-described process, as an active layer. In FIG. 7B, a p-channel transistor is used as the transistor 352. This is because supply of current to the EL element is continuously performed during a display period, that is, current is continuously supplied to the transistor, so that hot carrier deterioration or the like is concerned when an n-channel transistor is used. Thus, compressive strain is applied to the active layer of the p-channel transistor 352 included in the pixel portion, and mobility of holes is improved. Therefore, the p-channel transistor 352 can sufficiently supply current to the EL element even when the channel width is decreased.

As a subordinate effect, with improvement in mobility of the holes of the p-channel transistor, the arrangement area of the transistor 352 in the pixel portion can be relatively decreased and the aperture ratio (a ratio of a region which contributes to light emission to the whole area of the pixel portion) can be improved.

Polarities of transistors which lead improvement in mobility are different between the case where tensile strain is applied to a semiconductor layer and the case where compressive strain is applied to a semiconductor layer. Specifically, in the case where tensile strain is applied to a semiconductor layer, electron mobility is improved in an n-channel transistor, and in the case where compressive strain is applied to a semiconductor layer, hole mobility is improved in a p-channel transistor. In the semiconductor device of the present invention, in accordance with each characteristics of circuit groups, which semiconductor layer to be used to form a transistor for forming the circuit may be selected as appropriate.

Note that although a scan driver and a data driver are illustrated as circuits provided around the pixel portion in this embodiment mode, another logic circuit may be formed at the same time.

Subsequently, a specific structure of the pixel portion is described with reference to FIG. 7B.

A first electrode layer 320 serving as a pixel electrode layer is formed to be in contact with an electrode of the transistor 352. When light is emitted from the base substrate 1001 side, the first electrode layer 320 can be formed using a light-transmitting conductive material such as indium tin oxide (ITO), indium tin oxide containing silicon oxide (ITSO), indium zinc oxide (IZO) containing zinc oxide (ZnO), zinc oxide, ZnO doped with gallium (Ga), tin oxide ($SnO_2$), indium oxide containing tungsten oxide, indium zinc oxide containing tungsten oxide, indium oxide containing titanium oxide, or indium tin oxide containing titanium oxide.

In addition, even in the case of a material which does not have light-transmitting properties, such as a metal film, when the film thickness is made extremely thin (preferably approximately 5 to 30 nm) so that light can be transmitted, light can be emitted through the first electrode layer 320. As a metal thin film which can be used for the first electrode layer 320, a conductive film formed using titanium, tungsten, nickel, gold, platinum, silver, aluminum, magnesium, calcium, lithium, zinc, or alloy thereof, or a film formed using a compound material containing any of the above-described elements as a main component, such as titanium nitride or tungsten nitride can be used.

The connection structure of the first electrode layer 320 is not limited to that described in this embodiment mode as long as the first electrode layer 320 is electrically connected to a source electrode or drain electrode of the transistor 352. Alternatively, a structure may be employed in which an insulating layer serving as an interlayer insulating layer is formed over a source electrode or a drain electrode and is electrically connected to the first electrode layer 320 by a wiring layer. In the case where light is emitted in a direction opposite to the base substrate 1001 (the case where a top-emission display panel is manufactured), a metal material such as gold, silver, copper, tungsten, or aluminum can be used because the first electrode layer 320 does not need light-transmitting properties.

Further, an insulating layer 321 (also referred to as a partition) is formed as selected. The insulating layer 321 is formed so as to have an opening portion over the first electrode layer 320. In this embodiment mode, after the insulating layer 321 is formed over the entire surface, the insulating layer 321 is processed by being etched by a mask such as a resist. In the case of forming the insulating layer 321 by a droplet discharge method, a printing method, or the like, in which the insulating layer 321 can be directly formed as selected, processing by etching is not necessarily needed.

The insulating layer 321 can be formed using an inorganic insulating material such as silicon oxide, silicon nitride, silicon oxynitride, aluminum oxide, aluminum nitride, or aluminum oxynitride; an acrylic acid, a methacrylic acid, or a derivative thereof; a heat-resistant high molecule such as polyimide, aromatic polyamide, or polybenzimidazole; or a siloxane resin material. The insulating layer 321 preferably has a shape in which a radius of curvature changes continuously because coverage thereof with a light-emitting layer 322 and a second electrode layer 323 which are formed thereover is improved.

As the light-emitting layer 322, materials emitting light of red (R), green (G), and blue (B) are formed as selected by an evaporation method or the like using evaporation masks. Alternatively, the materials emitting light of red (R), green (G), and blue (B) can be formed by a droplet discharge method. Further alternatively, a laser transfer method may be used in which a substrate where the materials of respective colors are uniformly evaporated is prepared and provided so as to face with the base substrate 1001, and a light-emitting material is transferred to a desired position by laser irradiation or the like from the rear surface. When a droplet discharge method or a laser transfer method is used, the light-emitting material can be formed as selected at a desired position without using the evaporation masks A second electrode layer 323 is formed over the light-emitting layer 322, and the pixel portion is sealed with the counter substrate (sealing substrate) 1005. Therefore, a display device is completed.

Although not particularly shown, it is effective for improvement in reliability of a light-emitting element to provide a passivation film so as to cover the second electrode layer 323.

A passivation film which is provided when a display device is formed may have a single-layer structure or a stacked-layer structure. The passivation film is formed using an insulating film containing silicon nitride, silicon oxide, silicon oxynitride, silicon nitride oxide, aluminum nitride AlN), aluminum oxynitride, aluminum nitride oxide containing more nitrogen than oxygen, aluminum oxide, diamond-like carbon, or nitrogen-containing carbon, and the insulating film can have a single-layer structure or a stacked-layer structure. For example, a stacked-layer of a carbon-containing nitrogen film and a silicon nitride film or an organic material can be used, or a stacked-layer of a high molecular such as a styrene polymer may be used. Alternatively, a siloxane material (inorganic siloxane or organic siloxane) may be used.

In that case, it is preferable to use a film having favorable coverage as the passivation film, and it is effective to use a carbon film, particularly, a DLC film as the passivation film. Since a DLC film can be formed in the range from room temperature to 100° C., it can also be formed easily over an electroluminescent layer with low heat resistance. A DLC film has a high blocking effect against oxygen, and oxidization of the electroluminescent layer can be suppressed. Accordingly, a problem such as oxidation of the electroluminescent layer during a sealing step which is subsequently performed can be solved.

A space between the base substrate (insulating substrate) 1001 and the counter substrate (sealing substrate) 1005 is filled with a filler and can be sealed with a sealant. A dripping method can be used for filling the space with the filler. Instead of the filler, the space may be filled with an inert gas such as nitrogen. In addition, when a drying agent is provided in the display device, deterioration due to moisture in the light-emitting element can be prevented.

Note that the case where a light-emitting element and a liquid crystal element are sealed with a glass substrate is described in this embodiment mode. Sealing treatment corresponds to treatment for protecting a light-emitting element from moisture, and any of the following methods is used: a method of mechanically sealing with a cover material, a method of sealing with a thermosetting resin or an ultraviolet curable resin, and a method of sealing with a thin film having high barrier capability, which is formed using metal oxide, nitride, or the like. As a cover material, glass, ceramics, plastic, or metal can be used, and in the case where light is emitted on the cover material side, the cover material should have light-transmitting properties. In addition, the cover material and the substrate provided with the light-emitting element are attached with a sealant such as a thermosetting resin or an ultraviolet curable resin, and the resin is cured by heat treatment or ultraviolet irradiation treatment to form a hermetical space. It is effective to provide an absorbent material typified by barium oxide in the hermetical space. The absorbent material may be provided to be in contact with the sealant, or may be provided over a partition or at a peripheral portion so as not to impede light from the light-emitting element. Further, the space between the cover material and the substrate provided with the light-emitting element can be filled with a thermosetting resin or an ultraviolet curable resin. In this case, it is effective to add an absorbent material typified by barium oxide in the thermosetting resin or the ultraviolet curable resin.

Note that although the example where an EL element is used for a pixel portion as an example of a display device is described in this embodiment mode, the present invention does not limit the type of a display device. As described in this embodiment mode, also in a display device using a liquid crystal element for a pixel portion, a transistor formed using a single-crystal semiconductor layer and a transistor formed using a single-crystal semiconductor layer to which compressive strain is applied may be used for the peripheral circuit portion and the pixel portion, respectively, as appropriate.

Further, instead of the transistor formed using a single-crystal semiconductor layer, which is used for the peripheral circuit, a transistor formed using a single-crystal semiconductor layer to which tensile strain is applied may be used.

This embodiment mode can be combined with Embodiment Mode 1 as appropriate.

Embodiment Mode 3

In the semiconductor device of the present invention, a thin single-crystal semiconductor layer 150 and a thick single-crystal semiconductor layer 160 are formed over the base substrate 101 by being attached thereto; however, there is the case where part of a separation plane due to an ion irradiation step is left remaining on an outermost surface of each single-crystal semiconductor layer. Since the separation plane is a region which is in contact with a region where the weakened layer (the separation layer) is formed by hydrogen ion irradiation, the separation plane has flatness inferior to the surface of a normal single-crystal semiconductor layer. Therefore, it is necessary to improve the surface condition of the separation plane in order to prevent defects in subsequent steps.

As a typical method for removing such a separation plane, there is surface polishing by chemical mechanical polishing (CMP) as well as a method in which the separation plane is oxidized by surface oxidation and then the oxidized layer is removed in a reducing atmosphere, for example. In the present invention, the surface may be improved by any one of methods.

When the single-crystal semiconductor layers with different thicknesses, which are formed through the above steps, are used, a semiconductor device having low power consumption and high reliability, which is one mode of the present invention, can be manufactured.

This embodiment mode can be combined with Embodiment Mode 1 or 2 as appropriate.

Embodiment Mode 4

When the present invention is applied, a semiconductor device having a variety of display functions can be manufactured. That is, the present invention can be applied to a variety of electronic devices in which a semiconductor device having such display functions is incorporated in a display portion. In this embodiment mode, examples of electronic devices which include a semiconductor device having a display function, which aims at high performance and high reliability, are shown.

Examples of electronic devices of the present invention are a television set (also simply referred to as a television or a television receiver), a camera such as a digital camera or a digital video camera, a portable phone device (also simply referred to as a portable phone), a portable information terminal such as a PDA, a portable game machine, a computer monitor, a computer, an audio reproducing device such as a car audio component, an image reproducing device provided with a recording medium, such as a home-use game machine (e.g., a device which reproduces a digital versatile disc (DVD)), and the like. Specific examples thereof are described with reference to FIGS. 8A to 8E.

Figure 8A:
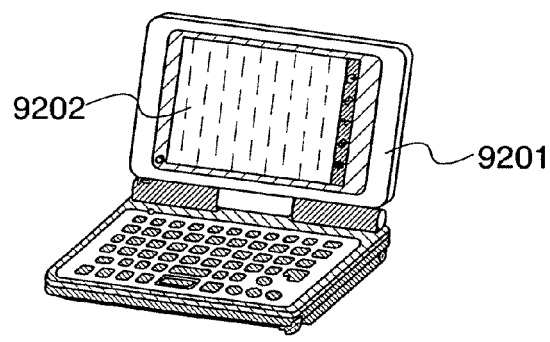
FIGS. 8A to 8E each illustrate an electronic device to which the present invention can be applied.

A portable information terminal shown in FIG. 8A includes a main body 9201, a display portion 9202, and the like. The semiconductor device of the present invention can be applied to the display portion 9202.

Figure 8B:
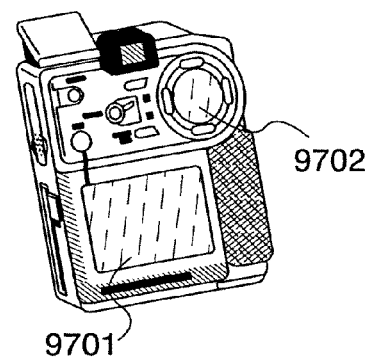

A digital video camera shown in FIG. 8B includes a display portion 9701, a display portion 9702, and the like. The semiconductor device of the present invention can be applied to the display portion 9701.

Figure 8C:
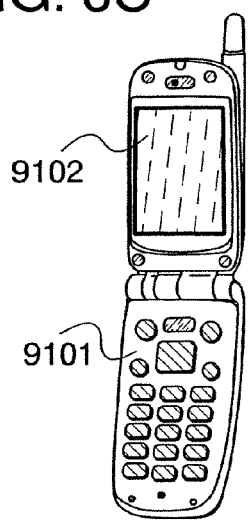

A mobile phone shown in FIG. 8C includes a main body 9101, a display portion 9102, and the like. The semiconductor device of the present invention can be applied to the display portion 9102.

Figure 8D:
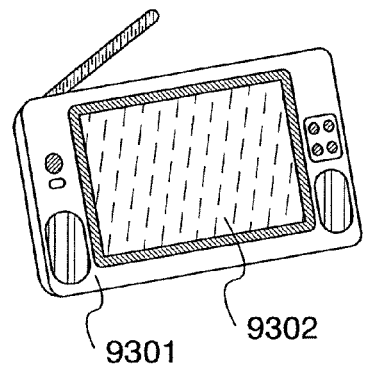

A portable television set shown in FIG. 8D includes a main body 9301, a display portion 9302, and the like. The semiconductor device of the present invention can be applied to the display portion 9302. Further, the semiconductor device of the present invention can be applied to a wide range of television sets ranging from a small-sized television set mounted on a portable terminal such as a mobile phone, a medium-sized television set which can be carried, to a large-sized (e.g., 40-inch or larger) television set.

Figure 8E:
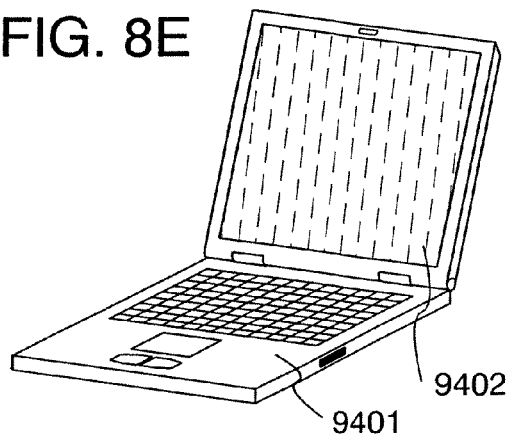

A portable computer shown in FIG. 8E includes a main body 9401, a display portion 9402, and the like. The semiconductor device of the present invention can be applied to the display portion 9402.

This embodiment mode can be combined with Embodiment Modes 1 to 3 as appropriate.

Embodiment Mode 5

A television set can be completed using a semiconductor device including a display element formed by the present invention. An example of a television set which has high performance and high reliability is described.

Figure 9:
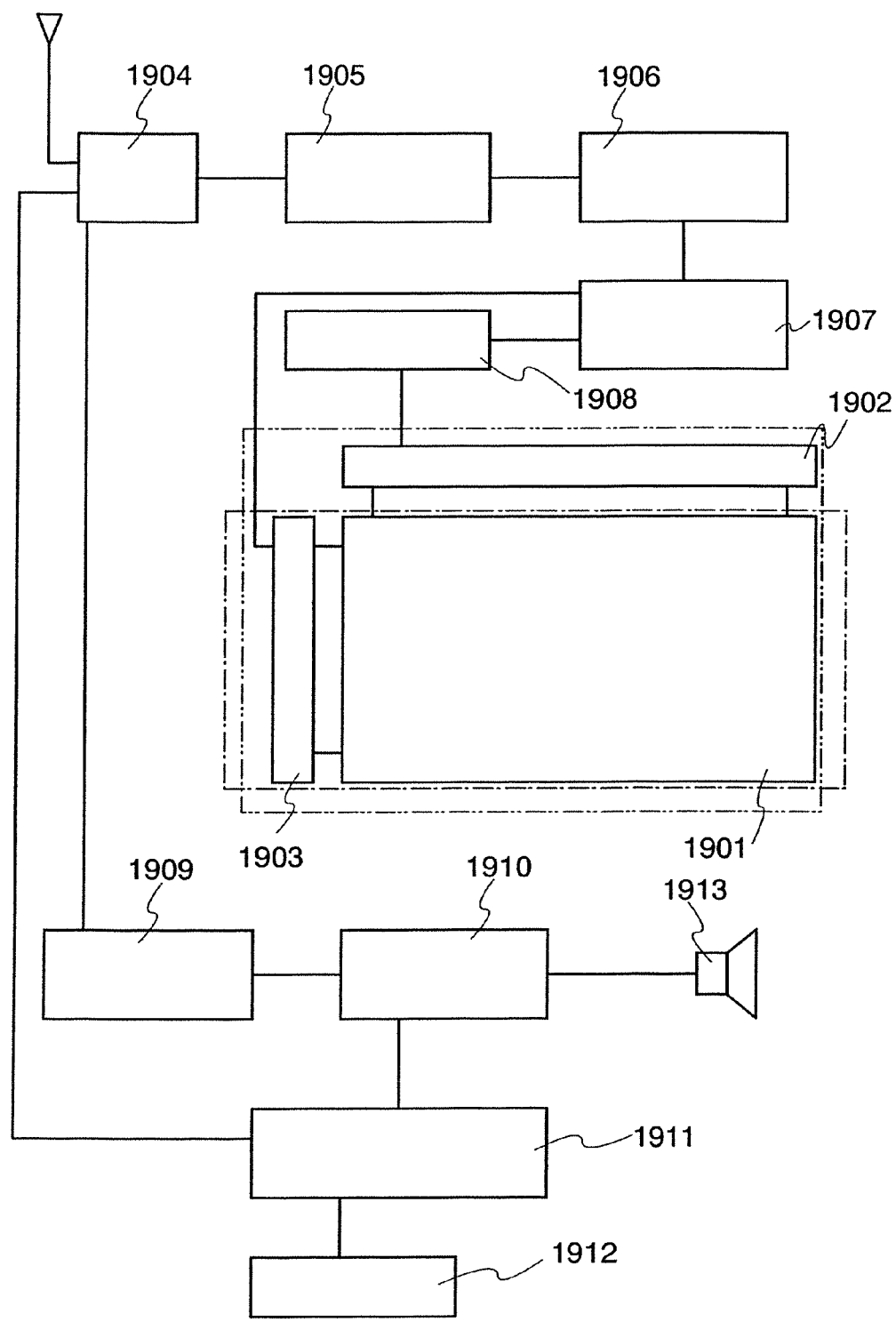
FIG. 9 is a block diagram illustrating a main structure of an electronic device to which the present invention can be applied.

FIG. 9 is a block diagram showing a main structure of a television set (a liquid crystal television set, an EL television set, or the like). A display panel can be formed in any mode as follows: a mode in which a TFT is formed, and a pixel region 1901 and a scan line driver circuit 1903 are formed over the same substrate, and a signal line driver circuit 1902 is separately mounted as a driver IC; a mode in which the pixel region 1901, the signal line driver circuit 1902, and the scan line driver circuit 1903 are formed over the same substrate; and the like.

As structures of other external circuits, a video signal amplifier circuit 1905 amplifying a video signal among signals received by a tuner 1904, a video signal processing circuit 1906 converting signals output from the video signal amplifier circuit 1905 into chrominance signals corresponding to respective colors of red, green, and blue, a control circuit 1907 for converting the video signal into a signal which meets input specifications of a driver IC, and the like are provided on an input side of the video signal. The control circuit 1907 outputs signals to both a scan line side and a signal line side. In the case of digital driving, a signal dividing circuit 1908 may be provided on the signal line side and an input digital signal may be divided into m pieces to be supplied.

Among the signals received by the tuner 1904, an audio signal is transmitted to an audio signal amplifier circuit 1909, and output thereof is supplied to a speaker 1913 through an audio signal processing circuit 1910. A control circuit 1911 receives control information on a receiving station (receiving frequency) or sound volume from an input portion 1912 and transmits the signal to the tuner 1904 or the audio signal processing circuit 1910.

Figure 10A:
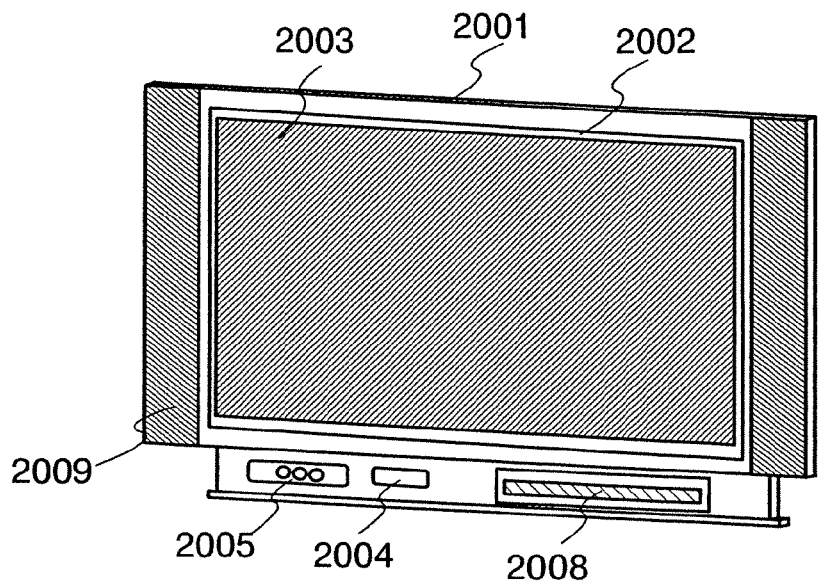
FIGS. 10A and 10B each illustrate an electronic device to which the present invention can be applied.
Figure 10B:
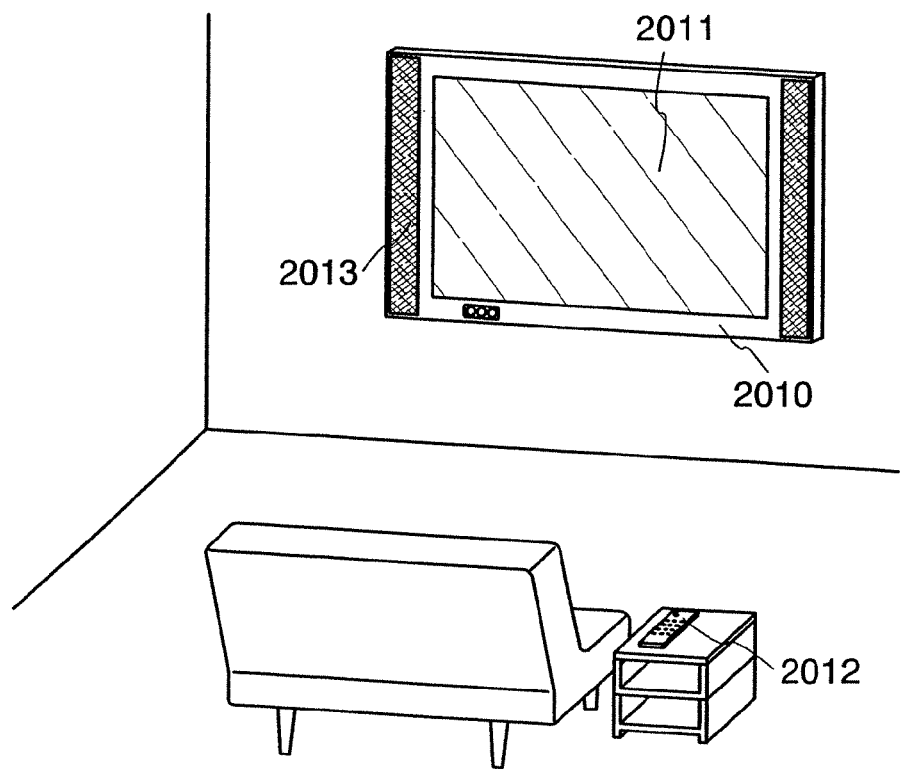

A television set can be completed when a display module is incorporated in a housing, as shown in FIGS. 10A and 10B. A display panel as shown in FIGS. 7A and 7B, on which an FPC is mounted, is also referred to as an EL display module generally. Thus, when an EL display module as shown in FIGS. 7A and 7B is used, an EL television set can be completed. When a liquid crystal display module is used, a liquid crystal television set can be completed. A main screen 2003 is formed using the display module, and a speaker portion 2009, operation switches, and the like are provided as its accessory equipment. Thus, a television set can be completed by the present invention.

In addition, reflected incident light from outside may be blocked by using a retardation plate or a polarizing plate. In the case of a top-emission semiconductor device, an insulating layer serving as a partition may be colored to be used as a black matrix. This partition can also be formed by a droplet discharge method or the like. Carbon black or the like may be mixed into a black resin of a pigment material or a resin material such as polyimide, or a laminate thereof may be used. By a droplet discharge method, different materials may be discharged to the same region plural times to form the partition. A λ/4 plate or a λ/2 plate may be used as the retardation plate and may be designed so that light can be controlled. As the structure, a light-emitting element, a sealing substrate (a sealant), the retardation plates (a λ/4 plate and a λ/2 plate), and the polarizing plate are sequentially formed in that order from the TFT element substrate side, and light emitted from the light-emitting element is transmitted therethrough and is emitted outside from the polarizing plate side. The retardation plate or the polarizing plate may be provided on a side to which light is emitted or can be provided on both sides in the case of a dual-emission semiconductor device in which light is emitted across the both sides. In addition, an antireflective film may be provided on the outer side of the polarizing plate. Thus, higher-definition and precise images can be displayed.

As shown in FIG. 10A, a display panel 2002 using a display element is incorporated in a housing 2001. When a receiver 2005 is used, including reception of general TV broadcast, communication of information can also be performed in one way (from a transmitter to a receiver) or in two ways (between a transmitter and a receiver or between receivers) by connection to a wired or wireless communication network through a modem 2004. The television set can be operated by switches incorporated in the housing or by a remote controller 2006 separated from the main body. A display portion 2007 displaying information to be output may also be provided in this remote controller.

In addition, in the television set, a structure for displaying a channel, sound volume, or the like may be added by forming a subscreen 2008 with a second display panel in addition to the main screen 2003. In this structure, the main screen 2003 may be formed using an EL display panel superior in the viewing angle, and the subscreen 2008 may be formed using a liquid crystal display panel capable of displaying images with low power consumption. Alternatively, in order to prioritize low power consumption, a structure in which the main screen 2003 is formed using a liquid crystal display panel, the subscreen 2008 is formed using an EL display panel, and the subscreen 2008 can flash on and off may be employed. When the present invention is used, a display device which has high performance and high reliability can be manufactured with high productivity even when such a large substrate and many TFTs and electronic components are used.

FIG. 10B shows a television set having a large display portion, for example, 20 to 80-inch display portion, which includes a housing 2010, a display portion 2011, a remote controller 2012 which is an operation portion, a speaker portion 2013, and the like. The present invention is applied to manufacture of the display portion 2011. The television set shown in FIG. 10B is a wall-hanging type and does not need a wide space.

Needless to say, the present invention is not limited to the television set, and can be applied to various uses particularly as a large display medium such as an information display board at a train station, an airport, or the like, or an advertisement display board on the street, as well as a monitor of a personal computer.

This embodiment mode can be combined with Embodiment Modes 1 to 4 as appropriate.

This application is based on Japanese Patent Application serial no. 2007-173452 filed with Japan Patent Office on Jun. 29, 2007, the entire contents of which are hereby incorporated by reference.

What is claimed is:

1. A method for manufacturing a semiconductor device comprising the steps of:
   irradiating a single-crystal semiconductor substrate with an ion to form a weakened layer inside the single-crystal semiconductor substrate;
   forming a bonding layer over a base substrate;
   bonding the bonding layer and the single-crystal semiconductor substrate to each other;
   separating a single-crystal semiconductor layer from the single-crystal semiconductor substrate with the weakened layer used as a separation surface; and
   generating heat shrink in the single-crystal semiconductor layer by heat treatment of the base substrate to generate a compressive strain in the single-crystal semiconductor layer.

2. The method for manufacturing a semiconductor device according to claim 1, further comprising:
   forming a second single-crystal semiconductor layer having a tensile strain over the base substrate after generating the heat shrink in the single-crystal semiconductor layer.

3. The method for manufacturing a semiconductor device according to claim 1, wherein the bonding layer is a silicon oxide film formed using an organic silane gas by a chemical vapor deposition method.

4. The method for manufacturing a semiconductor device according to claim 1, wherein the base substrate is a substrate having an insulating surface.

5. The method for manufacturing a semiconductor device according to claim 1, wherein the base substrate is a glass substrate.

6. A method for manufacturing a semiconductor device comprising the steps of:
 irradiating a single-crystal semiconductor substrate with an ion to form a weakened layer inside the single-crystal semiconductor substrate;
 forming a bonding layer over the single-crystal semiconductor substrate;
 bonding the bonding layer and a base substrate to each other;
 separating a single-crystal semiconductor layer from the single-crystal semiconductor substrate with the weakened layer used as a separation surface; and
 generating heat shrink in the single-crystal semiconductor layer by heat treatment of the base substrate to generate a compressive strain in the single-crystal semiconductor layer.

7. The method for manufacturing a semiconductor device according to claim 6, further comprising:
 forming a second single-crystal semiconductor layer having a tensile strain over the base substrate after generating the heat shrink in the single-crystal semiconductor layer.

8. The method for manufacturing a semiconductor device according to claim 6, wherein the bonding layer is a silicon oxide film formed using an organic silane gas by a chemical vapor deposition method.

9. The method for manufacturing a semiconductor device according to claim 6, wherein the base substrate is a substrate having an insulating surface.

10. The method for manufacturing a semiconductor device according to claim 6, wherein the base substrate is a glass substrate.

* * * * *